United States Patent
He et al.

(10) Patent No.: US 11,874,341 B2
(45) Date of Patent: Jan. 16, 2024

(54) METHOD FOR MONITORING ONLINE STATE OF BONDING WIRE OF IGBT MODULE

(71) Applicant: HEFEI UNIVERSITY OF TECHNOLOGY, Anhui (CN)

(72) Inventors: Yigang He, Anhui (CN); Kaiwei Li, Anhui (CN); Liulu He, Anhui (CN); Zhigang Li, Anhui (CN)

(73) Assignee: HEFEI UNIVERSITY OF TECHNOLOGY, Anhui (CN)

( * ) Notice: Subject to any disclaimer, the term of this patent is extended or adjusted under 35 U.S.C. 154(b) by 276 days.

(21) Appl. No.: 17/616,668

(22) PCT Filed: Jul. 29, 2019

(86) PCT No.: PCT/CN2019/098170
§ 371 (c)(1),
(2) Date: Dec. 5, 2021

(87) PCT Pub. No.: WO2020/244043
PCT Pub. Date: Dec. 10, 2020

(65) Prior Publication Data
US 2022/0326314 A1    Oct. 13, 2022

(30) Foreign Application Priority Data
Jun. 5, 2019 (CN) .......................... 201910484280.0

(51) Int. Cl.
*G01R 31/66* (2020.01)
*G01R 19/10* (2006.01)
*H01L 23/00* (2006.01)

(52) U.S. Cl.
CPC ............ *G01R 31/66* (2020.01); *G01R 19/10* (2013.01); *H01L 24/48* (2013.01); *H01L 2224/48225* (2013.01); *H01L 2924/13055* (2013.01)

(58) Field of Classification Search
CPC  G01R 31/66; G01R 31/2608; G01R 31/2601; H01L 2224/48225;
(Continued)

(56) References Cited

U.S. PATENT DOCUMENTS

2014/0103937 A1*  4/2014  Khan .................... G01R 31/40
                                        324/762.08
2016/0285387 A1*  9/2016  Rodriguez ............ H02M 7/493
(Continued)

FOREIGN PATENT DOCUMENTS

CN    104880657    9/2015
CN    105911446    8/2016
(Continued)

OTHER PUBLICATIONS

"International Search Report (Form PCT/ISA/210) of PCT/CN2019/098170", dated Mar. 6, 2020, with English translation thereof, pp. 1-5.

*Primary Examiner* — Dominic E Hawkins
(74) *Attorney, Agent, or Firm* — JCIPRNET (57) ABSTRACT

A method for monitoring an online state of a bonding wire of an Insulated Gate Bipolar Translator (IGBT) module comprises the following steps: Step 1, constructing a full bridge inverter circuit and an online measuring circuit and connecting two input ends of the online measuring circuit to a collecting electrode and an emitting electrode of an IGBT power module of the full bridge inverter circuit to realize a connection of the full bridge inverter circuit and the online measuring circuit; Step 2, establishing a three-dimensional data model of a healthy IGBT; Step 3, establishing a
(Continued)

three-dimensional data model of the IGBT with a broken bonding wire; Step 4, optimizing a least squares support vector machine by adopting a genetic algorithm; and Step 5, estimating states of the three-dimensional data models obtained in the Step 2 and the Step 3 by utilizing the optimized least squares support vector machine.

8 Claims, 5 Drawing Sheets

(58) Field of Classification Search
CPC . H01L 2224/73265; H01L 2224/48091; H01L 2224/48227
See application file for complete search history.

(56) References Cited

U.S. PATENT DOCUMENTS

| | | | |
|---|---|---|---|
| 2016/0315558 A1* | 10/2016 | Lee | H02M 7/5395 |
| 2017/0102437 A1* | 4/2017 | Singh | G01R 31/42 |
| 2020/0240850 A1* | 7/2020 | He | G01K 7/42 |

FOREIGN PATENT DOCUMENTS

| | | |
|---|---|---|
| CN | 107621782 | 1/2018 |
| CN | 108445371 | 8/2018 |
| CN | 108627753 | 10/2018 |
| CN | 109188232 | 1/2019 |

* cited by examiner

METHOD FOR MONITORING ONLINE STATE OF BONDING WIRE OF IGBT MODULE

CROSS-REFERENCE TO RELATED APPLICATION

This application is a 371 of international application of PCT application serial no. PCT/CN2019/098170, filed on Jul. 29, 2019, which claims the priority benefit of China application no. 201910484280.0, filed on Jun. 5, 2019. The entirety of each of the above mentioned patent applications is hereby incorporated by reference herein and made a part of this specification.

TECHNICAL FIELD

The present invention relates to the field of power electronics and electronic Information sciences, in particular to a method for monitoring an online state of a bonding wire of an IGBT module. A least squares support vector machine is optimized by utilizing a genetic algorithm to evaluate the state of a health condition of the bonding wire of the IGBT.

DESCRIPTION OF RELATED ART

A power converter apparatus is widely applied in the fields of intelligent power grids, rail traffic, new energy sources and the like, and the reliability of an Insulated Gate Bipolar Transistor (IGBT) as a core apparatus of the power converter apparatus guarantees safe operation of a system, so that it is extremely important for online monitoring and stat evaluation of the IGBT. Solder layer fatigue and bonding wire falling are two primary failing modes of the IGBT. As the solder layer technology is improved continuously, failures of the bonding wires of the IGBT modules receive wide attention.

A patent with the application number of 201410072990.X and the publication number of 104880657A discloses a method for detecting failures of an IGBT apparatus and a corresponding detection circuit. The circuit is provided with comparators corresponding to the quantity of the bonding wires. The number of the falling bonding wires of the IGBT is judged by means of a grid voltage signal, but the detection circuit is relatively complex and not high in precision. A patent with the application number of 201710318198.1 and the publication number of 107621782A discloses a method for diagnosing failures of an IGBT module. By measuring an emitter electrode voltage drop value of the IGBT in real time, a health state of the IGBT is diagnosed by using a least squares support vector machine model optimized by a quantum ant colony. However, influence of change of working conditions on the IGBT is not considered, and how to measure the emitter electrode voltage drop value of the IGBT module is not illustrated.

BRIEF SUMMARY OF THE INVENTION

To solve the deficiencies in the prior art, the present invention provides a method for monitoring an online state of a bonding wire of an Insulated Gate Bipolar Translator (IGBT) module. By considering influence of change of working conditions on the IGBT, a healthy IGBT three-dimensional data model and an IGBT three-dimensional data model with broken bonding wires are established. A least squares support vector machine is optimized by using a genetic algorithm to evaluate the state of the three-dimensional data model. Online monitoring of the saturation voltage drop of the IGBT is realized with high accuracy.

The technical scheme of the present invention to solve the technical scheme is as follows:

A method for monitoring an online state of a bonding wire of an Insulated Gate Bipolar Translator (IGBT) module includes the following steps:

Step 1, constructing a full bridge inverter circuit and a $V_{CE}$ online measuring circuit and connecting two input ends of the $V_{CE}$ online measuring circuit to a collecting electrode and an emitting electrode of an IGBT power module of the full bridge inverter circuit to realize a connection of the full bridge inverter circuit and the $V_{CE}$ online measuring circuit;

Step 2, establishing a three-dimensional data model of a healthy IGBT;

Step 3, establishing a three-dimensional data model of the IGBT with a broken bonding wire;

Step 4, optimizing a least squares support vector machine by adopting a genetic algorithm; and Step 5, estimating states of the three-dimensional data models obtained in the Step 2 and the Step 3 by utilizing the optimized least squares support vector machine.

According to the abovementioned scheme, the method for constructing a full bridge inverter circuit in the Step 1 specifically includes: constructing an Sine Pulse Width Modulation (SPWM) control circuit first, setting a dead time of the SPWM control circuit, and then constructing a gate level driving circuit, wherein the gate level driving circuit is modulated by the SPWM control circuit, an input end of the gate level driving circuit is connected with an output end of the SPWM control circuit, and an output end of the gate level driving circuit is connected with a grid electrode of the IGBT power module; the full bridge inverter circuit is provided with four bridge arms, and each of the bridge arms is composed of one SPWM control circuit, one gate level driving circuit, one IGBT power module and one diode; one end of a load of the full bridge inverter circuit is connected between the IGBT power modules of two adjacent bridge arms and another end of the load is connected between the IGBT power modules of another two adjacent bridge arms; and then constructing the $V_{CE}$ online measuring circuit, and finally connecting two input ends of the $V_{CE}$ online measuring circuit to a collecting electrode and an emitting electrode of the IGBT power module of one of the bridge arms of the full bridge inverter circuit.

According to the abovementioned scheme, the method for establishing the three-dimensional data model of the healthy IGBT specifically includes: simulating an environment temperature by adjusting a working temperature of a high-low temperature experimental box, wherein an environment temperature variation range simulated in the high-low temperature experimental box is 30-130° C., and controlling a forward on current variation range of the IGBT power module to be 20-60 A by changing the load of the full bridge inverter circuit; the IGBT power modules on the four bridge arms of the full bridge inverter circuit being healthy IGBT power modules, placing one of the healthy IGBT power modules in the high-low temperature experimental box, connecting the IGBT power module in the full bridge inverter circuit after the temperature is stable, and measuring a saturation voltage drop of the IGBT power module in the full bridge inverter circuit once at an interval of 2 A of the forward on current of the IGBT power module when the environment temperature simulated in the high-low temperature experimental box is at an interval of 5° C.; and performing surface fitting on the three-dimensional array ($T_a$, $I_c$, $V_{CE}$) by using a cftool tool box in Matlab to obtain a saturation voltage drop curved surface of the healthy IGBT power module, wherein $T_a$ represents the environment temperature simulated by the high-low temperature experimental box, $I_c$ represents the forward on current of the IGBT power module, and $V_{CE}$ represents the saturation voltage drop of the IGBT power module.

The IGBT power module generally includes at least two IGBT chips, and each IGBT chip is welded to an upper copper layer of a Direct Bonding Copper (DBC) ceramic substrate. A middle layer of the DBC substrate is a ceramic layer, so that functions of electrical insulation and supporting module are realized. Each IGBT chip is connected with the DBC substrate via an aluminum bonding wire, so that the electrical connection is realized. Experimental verification is performed by selecting the SKM50GB12T4 welded IGBT power module of existing mature SEMKRON series, and the IGBT chip of the model IGBT power module is connected with the DBC substrate via 6 bonding wires.

According to the abovementioned scheme, the method for establishing a three-dimensional data model of the IGBT with a broken bonding wire in the Step 3 specifically includes: under the premise of protecting encapsulation of the IGBT power module, performing a breaking experiment on the bonding wire of the IGBT power module manually (there are 6 bonding wires when the IGBT power module is the SKM50GB12T4 model of the existing mature SEMKRON series) to simulate a falling failure of the bonding wire due to a severe working environment or normal ageing in an actual working condition; placing the IGBT power module in the high-low temperature experimental box once one bonding wire is broken; simulating an environment temperature by adjusting a working temperature of a high-low temperature experimental box, wherein an environment temperature variation range simulated in the high-low temperature experimental box is 30-130° C., and controlling a forward on current variation range of the IGBT power module to be 20-60 A by changing the load of the full bridge inverter circuit; and measuring a saturation voltage drop of the IGBT power module in the full bridge inverter circuit once at an interval of 2 A of the forward on current of the IGBT power module when the environment temperature simulated in the high-low temperature experimental box is at an interval of 5° C. until all bonding wires in the IGBT power module are broken completely (until the 6 bonding wires are broken completely when the IGBT power module is the SKM50GB12T4 model of the existing mature SEMKRON series); performing surface fitting on experimental data by using the cftool tool box in Matlab to obtain a saturation voltage drop curved surface of the failed IGBT power module with the broken bonding wire, wherein the quantity of the saturation voltage drop curved surfaces of the failed IGBT with the broken bonding wires is equal to that of all bonding wires of the IGBT power module, and once a new bonding wire is broken, the corresponding saturation voltage drop curved surface of the failed IGBT with the broken bonding wire is obtained (for example, under the condition that there are 6 bonding wires, one bonding wire is broken to obtain the saturation voltage drop curved surface of the failed IGBT with one broken bonding wire; two bonding wires are broken to obtain the saturation voltage drop curved surface of the failed IGBT with two broken bonding wires; three bonding wires are broken to obtain the saturation voltage drop curved surface of the failed IGBT with three broken bonding wires; four bonding wires are broken to obtain the saturation voltage drop curved surface of the failed IGBT with four broken bonding wires; five bonding wires are broken to obtain the saturation voltage drop curved surface of the failed IGBT with five broken bonding wires; and six bonding wires are broken to obtain the saturation voltage drop curved surface of the failed IGBT with six broken bonding wires).

According to the abovementioned scheme, the method for optimizing a least squares support vector machine by adopting a genetic algorithm in the Step 4 specifically includes:

obtaining a series of three-dimensional arrays ($T_a$, $I_c$, $V_{CE}$) according to the saturation voltage drop curved surfaces of the healthy IGBT power modules and the saturation voltage drop curved surfaces of the failed IGBT with broken bonding wires, dividing all the three-dimensional arrays ($T_a$, $I_c$, $V_{CE}$) obtained according to the saturation voltage drop curved surfaces of the healthy IGBT power modules and the saturation voltage drop curved surfaces of the failed IGBT with broken bonding wires into two portions: a part of the saturation voltage drop curved surfaces is taken as a training sample and the other part of the saturation voltage drop curved surfaces is taken as a test sample;

wherein the three-dimensional arrays ($T_a$, $I_c$, $V_{CE}$) obtained according to the saturation voltage drop curved surfaces of the failed IGBT with broken bonding wires includes a three-dimensional array ($T_a$, $I_c$, $V_{CE}$) obtained according to the saturation voltage drop curved surface of the failed IGBT with one broken bonding wire, a three-dimensional array ($T_a$, $I_c$, $V_{CE}$) obtained according to the saturation voltage drop curved surface of the failed IGBT with two broken bonding wires, a three-dimensional array ($T_a$, $I_c$, $V_{CE}$) obtained according to the saturation voltage drop curved surface of the failed IGBT with the broken bonding wire A (A being greater than or equal to 1 but smaller than or equal to the total number of the bonding wires), and a three-dimensional array ($T_a$, $I_c$, $V_{CE}$) obtained according to the saturation voltage drop curved surfaces of the failed IGBT with all the broken bonding wires; and with respect to the least squares support vector machine, different kernel functions show different classifying properties.

According to the present invention, a Gaussian radial basis (RBF) kernel function in a form of $K(x_i,x_j)=\exp(-\|x_i-x_j\|^2/2\sigma^2)$ is used, wherein $\sigma$ represents a kernel parameter; selection of the kernel parameter $\sigma$ of the least squares support vector machine and a regularization parameter $\gamma$ of the least squares support vector machine may affect the classifying precision of the least squares support vector machine, and in order to classifying failures of the bonding wires of the IGBT power modules quickly and accurately, parameters of the least squares support vector machine are optimized by adopting a genetic algorithm (GA), specifically including steps of:

1) encoding: encoding the training sample with a Gray code;

2) generation of an initial population: randomly generating 50 groups of kernel parameters $\sigma$ and regularization parameters $\gamma$ of the least squares support vector machine, one group of parameters being a chromosome, totally 50 chromosomes, and $\gamma$ being two genes on the chromosomes, and initial value ranges of $\sigma$ and $\gamma$ being [0.1,100];

3) adaptability value evaluation detection: taking an accuracy obtained when cross validation (CV) is performed on the training sample as a adaptability value of each chromosome in the genetic algorithm;

4) selection: sequencing the adaptability values of the chromosomes from large to small, and selecting the values according to a random competition selection method;

5) crossover: arranging a crossover probability $p_c$=0.5 and selecting two points to crossover;

6) mutation: setting a mutation probability $p_m$=0.01 and selecting a new individual, generated by valid genetic mutation; and 7) a terminating condition: setting a maximum iteration number of times at 200, putting the test sample in the least squares support vector machine, wherein if the accuracy does not reach an index and the iteration number of times is smaller than 200, selection, crossover and mutation operations are performed, and if the accuracy reaches the index or the iteration number of times reaches 200, the chromosome individual with the maximum adaptability value is selected as the optimum parameter of the least squares support vector machine.

According to the abovementioned scheme, the method for estimating states of the three-dimensional data models by utilizing the optimized least squares support vector machine in the Step 5 specifically includes:

under a same condition, i.e., the forward on current and the environment temperature are same, obtaining a saturation voltage drop increment when A bonding wires of the IGBT are broken (A is greater than or equal to 1 but smaller than or equal to the total number of the bonding wires) according to a difference value between the saturation voltage drop obtained when the A bonding wires of the IGBT are broken and the saturation voltage drop when the IGBT is healthy/the saturation voltage drop when the IGBT is healthy, wherein "/" represents dividing.

The failures of the bonding wires of the IGBT modules are divided into three grades according to the saturation voltage drop increment: healthy, the bonding wire failure (1-3) and chip failure (4-6), wherein the corresponding saturation voltage drop increment intervals are respectively $\Delta V_{CE}$<1%, 1%≤$\Delta V_{CE}$<5% and $\Delta V_{CE}$≥5%, labels 1, 2 and 3 respectively represent the three grades: the failed bonding wires of the IGBT modules are healthy, the bonding wire failure and the chip failure;

constructing a classifying decision making function of the least squares support vector machine according to the obtained optimum parameter of the least squares support vector machine, wherein an output of the classifying decision making function of the least squares support vector machine is a grade of failure of the bonding wires of the IGBT modules, an output of the classifying decision making function of the least squares support vector machine is 1, 2 or 3, and 1, 2 or 3 respectively represent three grades: the failed bonding wires of the IGBT modules are healthy, the bonding wire failure and chip failure;

an input of the classifying decision making function of the least squares support vector machine is a saturation voltage drop of the IGBT power module measured under a working condition, i.e., the environment temperature and the on current are determined;

giving a training sample set {$(x_1, y_1), \ldots, (x_n, y_n)$}, wherein n represents a capacity of the training samples, $x_i \in R^n$ represents the $i^{th}$ training sample, $y_i$ represents an expected output of the $i^{th}$ training sample, i.e., a class label;

one training sample $x_i$ corresponds to one three-dimensional array $(T_a, I_c, V_{CE})$;

when the three-dimensional array $(T_a, I_c, V_{CE})$ as the training sample $x_i$ is obtained according to the saturation voltage drop curved surface of the healthy IGBT power module and an increment of the saturation voltage drop is $\Delta V_{CE}$<1%, the expected output $y_i$ of the training sample is equal to 1;

when the three-dimensional array $(T_a, I_c, V_{CE})$ as the training sample $x_i$ is obtained according to the saturation voltage drop curved surfaces of the IGBT with the broken bonding wires (1-3 bonding wires are broken) and an increment of the saturation voltage drop is 1%≤$\Delta V_{CE}$<5%, the expected output $y_i$ of the training sample is equal to 2; when the three-dimensional array $(T_a, I_c, V_{CE})$ as the training sample $x_i$ is obtained according to the saturation voltage drop curved surfaces of the IGBT with the broken bonding wires (4-6 bonding wires are broken) and an increment of the saturation voltage drop is $\Delta V_{CE}$≥5%, the expected output $y_i$ of the training sample is equal to 3;

the classifying decision making function of the least squares support vector machine constructed according to the obtained optimum parameter of the least squares support vector machine is:

$$f(x) = \text{sgn}\left[\sum_{i=1}^{n} \omega^T K(x_i, x_j) + b\right],$$

wherein $\omega$ represents a weight vector, b represents an offset constant, $K(x_i, x_j)$ represents the kernel function of the least squares support vector machine, $K(x_i, x_j)=\exp(-\|x_i-x_j\|^2/2\sigma^2)$ is a function of the kernel parameter $\sigma$, $x_i$ and $x_j$ respectively represent the $i^{th}$ and $j^{th}$ sample inputs, $\omega$ and b can be determined by solving a target function of the least squares support vector machine, the target function being:

$$\min_{\omega,b,\xi} J(\omega, \xi) = \frac{1}{2}\|\omega\|^2 + \frac{\gamma}{2}\sum_{i=1}^{n}\xi_i^2;$$

a constraint condition is as follows:

$$y_i[\omega^T \cdot \varphi(x_i) + b] = 1 - \xi_i, i = 1, 2, \ldots, n$$

wherein $x_i$ and $y_i$ respectively represent the $i^{th}$ training sample input and a corresponding output thereof, n represents the capacity of the training samples, $\gamma$ is the regularization parameter, $\xi_i$ is a relaxing factor, and $\xi_i \geq 0$, $\varphi(\cdot)$ is a mapping function of a kernel space.

Compared with the prior art, the present invention has the following beneficial effects:

1. The method for monitoring an online state of a bonding wire of an Insulated Gate Bipolar Translator (IGBT) module provided by the present invention is realized on the full bridge inverter, the saturation voltage drop $V_{CE}$ of the IGBT is selected as an indicating parameter representing a health condition of the bonding wire, a set of $V_{CE}$ online measuring circuit is designed, and the circuit not only can measure the saturation voltage drop precisely and is high in interference resistance, but also can extract IGBT junction temperature indirectly;

2. The present invention considers influence of changes of working conditions on the IGBT to establish the three-dimensional data model of the environment temperature, the forward on current of the IGBT and the saturation voltage drop of the IGBT, thereby better simulating an actual working condition of the IGBT; and 3. hyper-parameters (i.e., kernel parameter $\sigma$ and regularization parameter $\gamma$) of the least squares support vector machine are optimized by using the genetic algorithm, then the state o the three-dimensional data model is evaluated by using the optimized least squares support vector machine, and compared with other algorithms, the present invention has the advantages of higher accuracy and shorted operation time.

DETAILED DESCRIPTION OF THE INVENTION

Further description of the present invention will be made below in combination with specific embodiments and drawings.

Experimental verification is performed by selecting the SKM50GB12T4 model power module of SEMKRON series, and the chip thereof is connected with the substrate in parallel via 6 bonding wires.

Figure 1:
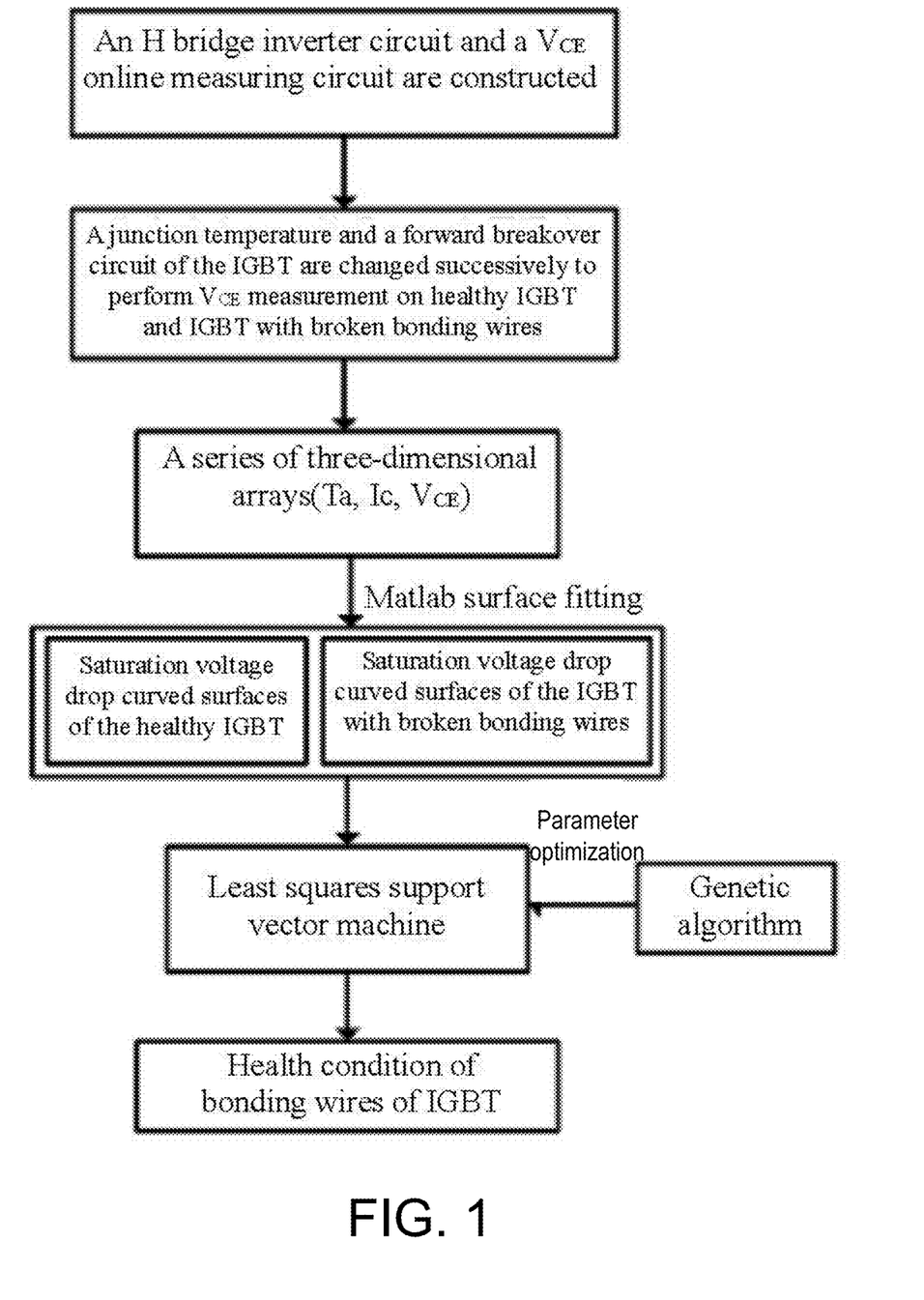
FIG. 1 is a flow diagram of a method for monitoring an online state of a bonding wire of an Insulated Gate Bipolar Translator (IGBT) module.
Figure 3:
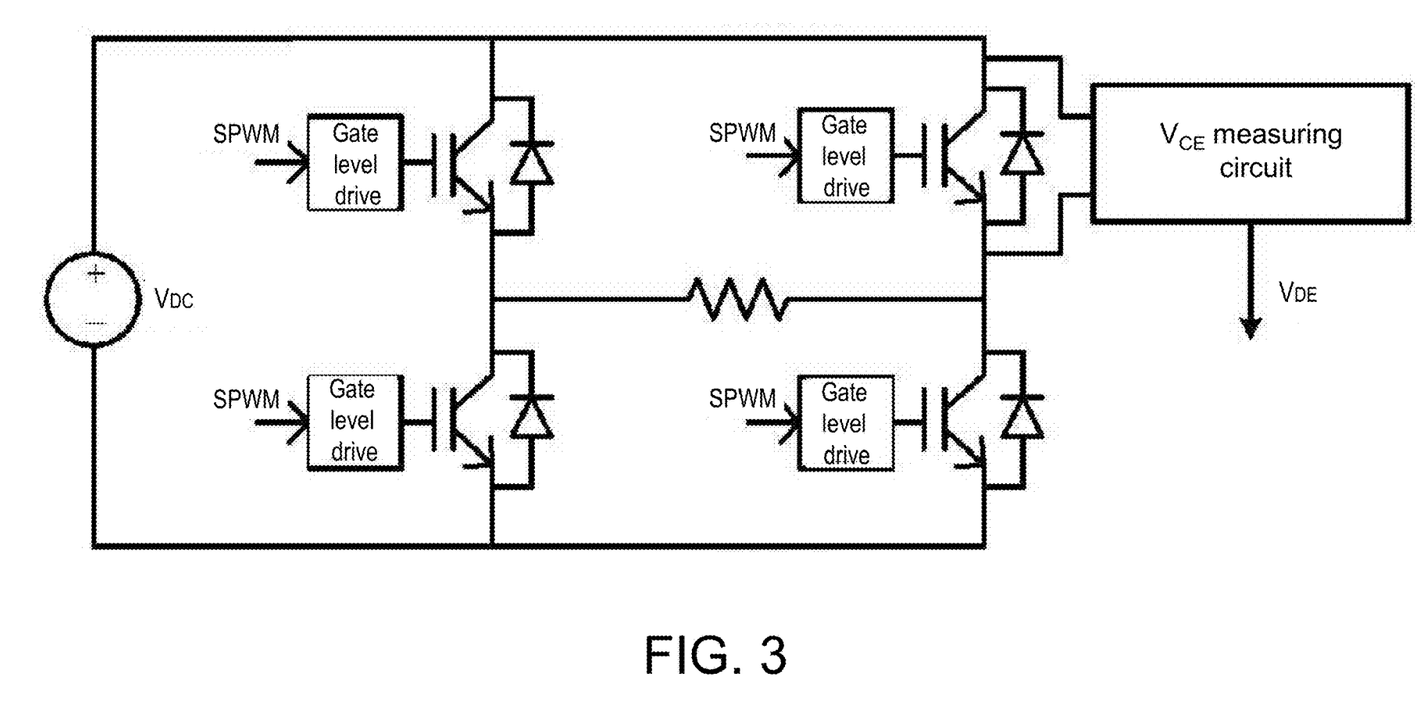
FIG. 3 is a full bridge inverter circuit diagram.

As shown in FIG. 1, the present invention provides a method for monitoring an online state of a bonding wire of an Insulated Gate Bipolar Translator (IGBT) module. Detailed introduction on an implementation process of the method is made below by taking the full bridge inverter circuit shown in FIG. 3 as an example, including the following specific implementation steps:

Step 1, a full bridge inverter circuit and a $V_{CE}$ online measuring circuit are constructed and two input ends of the online measuring circuit are connected to a collecting electrode and an emitting electrode of an IGBT power module of the full bridge inverter circuit to realize a connection of the full bridge inverter circuit and the $V_{CE}$ online measuring circuit;

the full bridge inverter circuit, the $V_{CE}$ online measuring circuit, a Sine Pulse Width Modulation (SPWM) control circuit and the gate level driving circuit are constructed, and two input ends of the $V_{CE}$ online measuring circuit are connected to a collecting electrode and an emitting electrode of an IGBT of the full bridge inverter circuit to realize a connection of the full bridge inverter circuit and the online measuring circuit, as shown in FIG. 3.

Referring to FIG. 3, constructing the full bridge inverter circuit specifically includes:

the SPWM control circuit is constructed first, the gate level driving circuit is constructed and is modulated by the SPWM control circuit, the input end of the gate level driving circuit is connected with the output end of the SPWM control circuit, and the output end of the gate level driving circuit is connected with a grid electrode of the IGBT power module; the full bridge inverter circuit is provided with four bridge arms, and each of the bridge arms is composed of one SPWM control circuit, one gate level driving circuit, one IGBT power module and one diode; one end of a load of the full bridge inverter circuit is connected between the IGBT power modules of two adjacent bridge arms and another end of the load is connected between the IGBT power modules of another two adjacent bridge arms. In order to avoid simultaneous conduction of the two IGBT in the upper and lower bridge arms of the full bridge inverter due to a switching speed problem of the gate level driving circuit, it is necessary to set a reasonable dead time.

Figure 4:
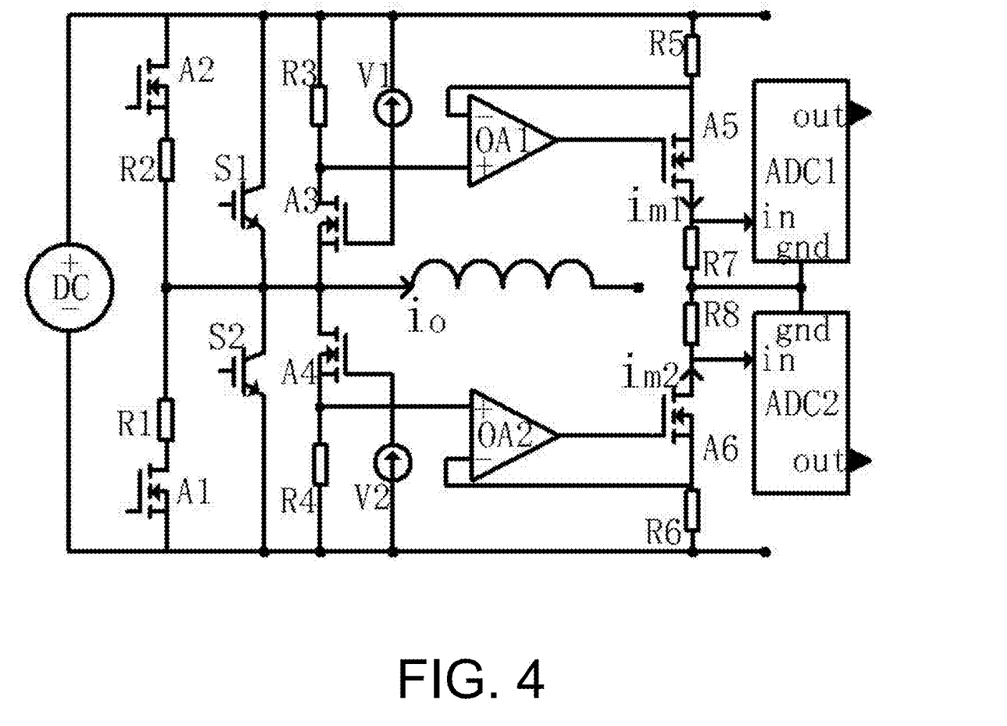
FIG. 4 is a $V_{CE}$ online measuring circuit.

Then the $V_{CE}$ online measuring circuit is constructed. In the $V_{CE}$ online measuring circuit shown in FIG. 4, two input ends of the $V_{CE}$ online measuring circuit are respectively connected with the collecting electrode and the emitting electrode.

Step 2, the three-dimensional data model of the healthy IGBT is established; an environment temperature is simulated by adjusting a working temperature of a high-low temperature experimental box, wherein an environment temperature variation range simulated in the high-low temperature experimental box is 30-130° C., and a forward on current variation range of the IGBT power module is controlled to be 20-60 A by changing the load of the full bridge inverter circuit; the IGBT power modules on the four bridge arms of the full bridge inverter circuit being healthy IGBT power modules, one of the healthy IGBT power modules is placed in the high-low temperature experimental box, the IGBT power module in the full bridge inverter circuit is connected after the temperature is stable, and a saturation voltage drop of the IGBT power module is measured in the full bridge inverter circuit once at an interval of 2 A of the forward on current of the IGBT power module when the environment temperature simulated in the high-low temperature experimental box is at an interval of 5° C.; and surface fitting is performed on the three-dimensional array $(T_a, I_c, V_{CE})$ by using a cftool tool box in Matlab to obtain a saturation voltage drop curved surface of the healthy IGBT power module, wherein $T_a$ represents the environment temperature simulated by the high-low temperature experimental box, $I_c$ represents the forward on current of the IGBT power module, and $V_{CE}$ represents the saturation voltage drop of the IGBT power module.

Figure 2:
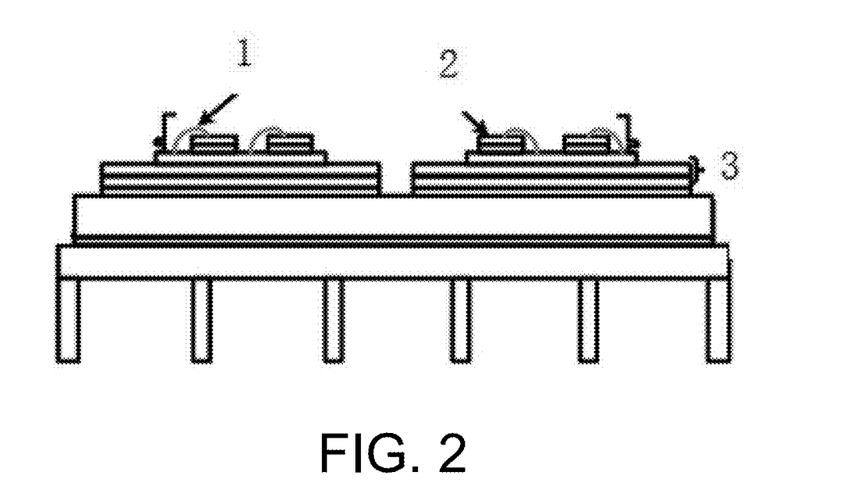
FIG. 2 is a structural schematic diagram of the IGBT module.

Referring to FIG. 2, the IGBT power module generally includes at least two IGBT chips, and each IGBT chip is welded to an upper copper layer of a Direct Bonding Copper (DBC) ceramic substrate. A middle layer of the DBC substrate is a ceramic layer, so that functions of electrical insulation and supporting module are realized. Each IGBT chip is connected with the DBC substrate via an aluminum bonding wire, so that the electrical connection is realized. Experimental verification is performed by selecting the SKM50GB12T4 welded IGBT power module of existing mature SEMKRON series, and the IGBT chip of the model IGBT power module is connected with the DBC substrate via 6 bonding wires. In FIG. 2, the label 1 represents the bonding wire, the label 2 represents the chip of the IGBT and the label 3 represents the DBC substrate.

Figure 5:
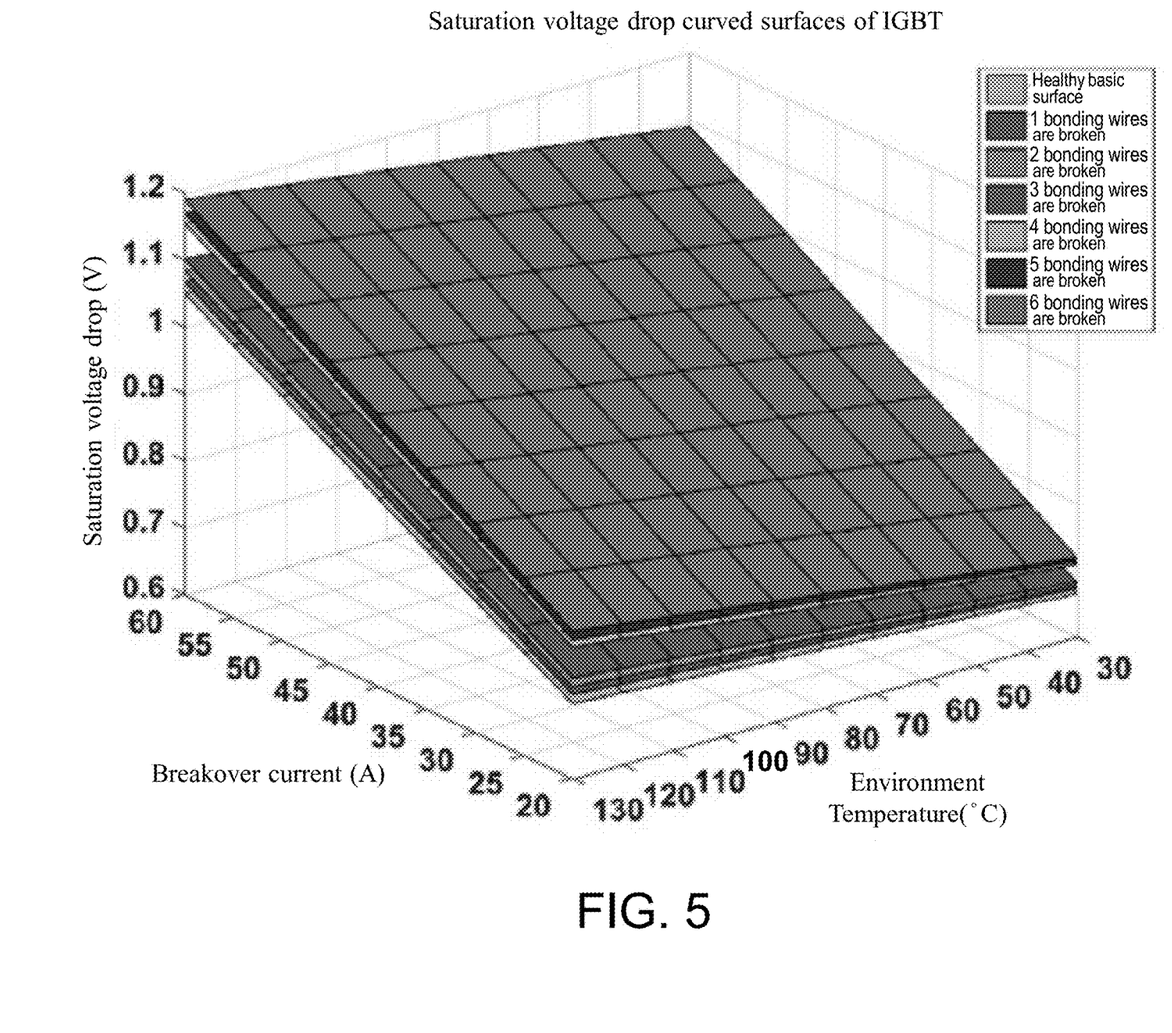
FIG. 5 is saturation voltage drop curved surfaces of the healthy IGBT and the IGBT with broken bonding wires.

Step 3, the three-dimensional data model of the IGBT with a broken bonding wire is established: under the premise of protecting encapsulation of the IGBT power module, a breaking experiment is performed on the bonding wire of the IGBT power module manually (there are 6 bonding wires when the IGBT power module is the SKM50GB12T4 model of the existing mature SEMKRON series) to simulate a falling failure of the bonding wire due to a severe working environment or normal ageing in an actual working condition; the IGBT power module is placed in the high-low temperature experimental box once one bonding wire is broken; an environment temperature is simulated by adjusting a working temperature of a high-low temperature experimental box, wherein an environment temperature variation range simulated in the high-low temperature experimental box is 30-130° C., and a forward on current variation range of the IGBT power module is controlled to be 20-60 A by changing the load of the full bridge inverter circuit; and a saturation voltage drop of the IGBT power module in the full bridge inverter circuit is measured once at an interval of 2 A of the forward on current of the IGBT power module when the environment temperature simulated in the high-low temperature experimental box is at an interval of 5° C. until all bonding wires in the IGBT power module are broken completely (until the 6 bonding wires are broken completely when the IGBT power module is the SKM50GB12T4 model of the existing mature SEMKRON series). Surface fitting is performed on experimental data by using the cftool tool box in Matlab to obtain a saturation voltage drop curved surface of the failed IGBT power module with the broken bonding wire, wherein the quantity of the saturation voltage drop curved surfaces of the failed IGBT with the broken bonding wires is equal to that of all bonding wires of the IGBT power module, and once a new bonding wire is broken, the corresponding saturation voltage drop curved surface of the failed IGBT with the broken bonding wire is obtained (referring to FIG. 5, under the condition that there are 6 bonding wires, one bonding wire is broken to obtain the saturation voltage drop curved surface of the failed IGBT with one broken bonding wire; two bonding wires are broken to obtain the saturation voltage drop curved surface of the failed IGBT with two broken bonding wires; three bonding wires are broken to obtain the saturation voltage drop curved surface of the failed IGBT with three broken bonding wires; four bonding wires are broken to obtain the saturation voltage drop curved surface of the failed IGBT with four broken bonding wires; five bonding wires are broken to obtain the saturation voltage drop curved surface of the failed IGBT with five broken bonding wires; and six bonding wires are broken to obtain the saturation voltage drop curved surface of the failed IGBT with six broken bonding wires).

Step 4, a least squares support vector machine is optimized by adopting a genetic algorithm:

a series of three-dimensional arrays $(T_a, I_c, V_{CE})$ is obtained according to the saturation voltage drop curved surfaces of the healthy IGBT power modules and the saturation voltage drop curved surfaces of the failed IGBT with broken bonding wires, all the three-dimensional arrays $(T_a, I_c, V_{CE})$ obtained are divided according to the saturation voltage drop curved surfaces of the healthy IGBT power modules and the saturation voltage drop curved surfaces of the failed IGBT with broken bonding wires into two portions: a part of the saturation voltage drop curved surfaces is taken as a training sample and the other part of the saturation voltage drop curved surfaces is taken as a test sample;

wherein the three-dimensional arrays $(T_a, I_c, V_{CE})$ obtained according to the saturation voltage drop curved surfaces of the failed IGBT with broken bonding wires includes a three-dimensional array $(T_a, I_c, V_{CE})$ obtained according to the saturation voltage drop curved surface of the failed IGBT with one broken bonding wire, a three-dimensional array $(T_a, I_c, V_{CE})$ obtained according to the saturation voltage drop curved surface of the failed IGBT with two broken bonding wires, a three-dimensional array $(T_a, I_c, V_{CE})$ obtained according to the saturation voltage drop curved surface of the failed IGBT with the broken bonding wire A (A being greater than or equal to 1 but smaller than or equal to the total number of the bonding wires), and a three-dimensional array $(T_a, I_c, V_{CE})$ obtained according to the saturation voltage drop curved surfaces of the failed IGBT with all the broken bonding wires; and with respect to the least squares support vector machine, different kernel functions show different classifying properties.

According to the present invention, a Gaussian radial basis (RBF) kernel function in a form of $L(x_i, x_j) = \exp(-\|x_i - x_j\|^2 / 2\sigma^2)$ is used, wherein σ represents a kernel parameter; selection of the kernel parameter σ of the least squares support vector machine and a regularization parameter γ of the least squares support vector machine may affect the classifying precision of the least squares support vector machine, and in order to classifying failures of the bonding wires of the IGBT power modules quickly and accurately, parameters of the least squares support vector machine are optimized by adopting a genetic algorithm (GA), specifically including steps of:

1) encoding: the training sample is encoded with a Gray code;

2) generation of an initial population: 50 groups of kernel parameters and regularization parameters Y of the least squares support vector machine are randomly generated, one group of parameters being a chromosome, totally 50 chromosomes, σ and γ being two genes on the chromosomes, and initial value ranges of σ and γ being [0.1,100];

3) adaptability value evaluation detection: an accuracy obtained when cross validation (CV) is performed on the training sample is taken as a adaptability value of each chromosome in the genetic algorithm;

4) selection: the adaptability values of the chromosomes are sequenced from large to small, and the values are selected according to a random competition selection method;

5) crossover: a crossover probability is set $p_c$=0.5 and two points to crossover is selected;

6) mutation: a mutation probability $p_m$=0.01 is set, and a new individual generated by valid genetic mutation is selected; and 7) a terminating condition: a maximum iteration number of times is set at 200, the test sample is put in the least squares support vector machine, wherein if the accuracy does not reach an index and the iteration number of times is smaller than 200, selection, crossover and mutation operations are performed, and if the accuracy reaches the index or the iteration number of times reaches 200, the chromosome individual with the maximum adaptability value is selected as the optimum parameter of the least squares support vector machine.

Step 5, states of the three-dimensional data models are evaluated by utilizing the optimized least squares support vector machine:

under a same condition, i.e., the forward on current and the environment temperature are same, a saturation voltage drop increment is obtained when A bonding wires of the IGBT are broken (A is greater than or equal to 1 but smaller than or equal to the total number of the bonding wires) according to a difference value between the saturation voltage drop obtained when the A bonding wires of the IGBT are broken and the saturation voltage drop when the IGBT is healthy/the saturation voltage drop when the IGBT is healthy.

The failures of the bonding wires of the IGBT modules are divided into three grades according to the saturation voltage drop increment: healthy, the bonding wire failure (1-3 bonding wires are broken) and chip failure (4-6 bonding wires are broken), wherein the corresponding saturation voltage drop increment intervals are respectively $\Delta V_{CE} < 1\%$ $1\% \leq \Delta V_{CE} < 5\%$ and $\Delta V_{CE} \geq 5\%$; labels 1, 2 and 3 respectively represent the three grades: the failed bonding wires of the IGBT modules are healthy, the bonding wire failure and chip failure;

a classifying decision making function of the least squares support vector machine is constructed according to the obtained optimum parameter of the least squares support vector machine, wherein an output of the classifying decision making function of the least squares support vector machine is a grade of failure of the bonding wires of the IGBT modules, an output of the classifying decision making function of the least squares support vector machine is 1, 2 or 3, and 1, 2 or 3 respectively represent three grades: the failed bonding wires of the IGBT modules are healthy, the bonding wire failure and chip failure;

an input of the classifying decision making function of the least squares support vector machine is a saturation voltage drop of the IGBT power module measured under a working condition, i.e., the environment temperature and the on current are determined;

a training sample set $\{(x_1, y_1), \ldots, (x_n, y_n)\}$ is given, wherein n represents a capacity of the training samples, $x_i \in R^n$ represents the $i^{th}$ training sample, $Y_i$ represents an expected output of the $i^{th}$ training sample, i.e., a class label;

one training sample $x_i$ corresponds to one three-dimensional array $(T_a, I_c, V_{CE})$;

when the three-dimensional array $(T_a, I_c, V_{CE})$ as the training sample $x_i$ is obtained according to the saturation voltage drop curved surface of the healthy IGBT power module and an increment of the saturation voltage drop is $\Delta V_{CE} < 1\%$, the expected output $y_i$ of the training sample is equal to 1;

when the three-dimensional array $(T_a, I_c, V_{CE})$ as the training sample $x_i$ is obtained according to the saturation voltage drop curved surfaces of the IGBT with the broken bonding wires (1-3 bonding wires are broken) and an increment of the saturation voltage drop is $1\% \leq \Delta V_{CE} < 5\%$, the expected output $y_i$ of the training sample is equal to 2; when the three-dimensional array $(T_a, I_c, V_{CE})$ as the training sample $x_i$ is obtained according to the saturation voltage drop curved surfaces of the IGBT with the broken bonding wires (4-6 bonding wires are broken) and an increment of the saturation voltage drop is $\Delta V_{CE} \geq 5\%$, the expected output $y_i$ of the training sample is equal to 3;

the classifying decision making function of the least squares support vector machine constructed according to the obtained optimum parameter of the least squares support vector machine is:

$$f(x) = \text{sgn}\left[\sum_{i=1}^{n} \omega^T K(x_i, x_j) + b\right],$$

wherein $\omega$ represents a weight vector, b represents an offset constant, $L(x_i, y_j)$ represents the kernel function of the least squares support vector machine, $K(x_i, x_j) = \exp(-\|x_i - x_j\|^2 / 2\sigma^2)$ is a function of the kernel parameter $\sigma$, $x_i$ and $x_j$ respectively represent the $i^{th}$ and $j^{th}$ sample inputs, $\omega$ and b can be determined by solving a target function of the least squares support vector machine, the target function being:

$$\min_{\omega, b, \xi} J(\omega, \xi) = \frac{1}{2}\|\omega\|^2 + \frac{\gamma}{2}\sum_{i=1}^{n}\xi_i^2;$$

a constraint condition is as follows:

$y_i[\omega^T \cdot \varphi(x_i) + b] = 1 - \xi_i, i = 1, 2, \ldots, n,$ wherein $x_i$ and $y_i$ respectively represent the $i^{th}$ training sample input and a corresponding output thereof, n represents the capacity of the training samples, $\gamma$ is the regularization parameter, $\xi_i$ is a relaxing factor, and $\xi_i \geq 0$, $\varphi(\cdot)$ is a mapping function of a kernel space.

In the embodiment, the failures of the bonding wires of the IGBT modules are divided into three grades according to the saturation voltage drop increment: healthy, the bonding wire failure (1-3 bonding wires are broken) and chip failure (4-6 bonding wires are broken), wherein the corresponding saturation voltage drop increment intervals are respectively $\Delta V_{CE} < 1\%$ $1\% \leq \Delta V_{CE} < 5\%$ and $\Delta V_{CE} \geq 5\%$; the labels 1, 2 and 3 respectively represent the three grades of failures of the bonding wires of the IGBT modules. Then, $y_i \in E\{1,2,3\}$. 1 group of healthy signals and 6 groups of failure signals of the IGBT module are collected by experiments, and 441 data points are extracted from each group of signals, totally 3087 data points. 341 data points in each group of signals are utilized, totaling, 2387 data points, as training data, and other 700 data points are taken as test sample data. Table 1 is a state evaluation result of the optimized least squares support vector machine.

TABLE 1

| GA-LS-SVM state evaluation result | |
|---|---|
| Grade division | Accuracy (%) |
| Healthy | 96 |
| Failures of bonding wires | 96 |
| Failures of chip | 98 |
| Total accuracy | 96.67 |

It can be seen from the Table 1 that the failures of the bonding wires of the IGBT modules are classified precisely by optimizing the least squares support vector machine based on the genetic algorithm with relatively high accuracy.

Feasibility of the present invention is further verified from the side view. Apparently, the embodiments are merely examples made for describing the present invention clearly and are not to limit the embodiments of the present invention. Changes or variations in other different forms can be further made by those skilled in the art on a basis of the description. Apparent changes or variations explicated from spirit of the present invention still fall into the scope of protection of the present invention.

What is claimed is:

1. A method for monitoring an online state of a bonding wire of an insulated gate bipolar translator (IGBT) module, comprising the following steps:
   step 1: constructing a full bridge inverter circuit and a $V_{CE}$ online measuring circuit and connecting two input ends of the $V_{CE}$ online measuring circuit to a collecting electrode and an emitting electrode of an IGBT power module of the full bridge inverter circuit to realize a connection of the full bridge inverter circuit and the CF online measuring circuit;
   step 2: establishing a three-dimensional data model of a healthy IGBT;
   step 3: establishing a three-dimensional data model of an IGBT with a broken bonding wire;
   step 4: optimizing a least squares support vector machine by adopting a genetic algorithm; and
   step 5: estimating states of the three-dimensional data models obtained in the step 2 and the step 3 by utilizing the least squares support vector machine optimized.

2. The method for monitoring the online state of the bonding wire of the IGBT module according to claim 1, wherein a specific method for constructing the full bridge inverter circuit in the step 1 comprises:
   constructing a Sinusoidal Pulse Width Modulation (SPWM) control circuit first, setting a dead time of the SPWM control circuit, and then constructing a gate level driving circuit, wherein the gate level driving circuit is modulated by the SPWM control circuit, an input end of the gate level driving circuit is connected with an output end of the SPWM control circuit, and an output end of the gate level driving circuit is connected with a gate electrode of the IGBT power module; the full bridge inverter circuit comprises four bridge arms, and each of the bridge arms is composed of one SPWM control circuit, one gate level driving circuit, one IGBT power module and one diode; one end of a load of the full bridge inverter circuit is connected between the IGBT power modules of two adjacent bridge arms and another end of the load is connected between the IGBT power modules of another two adjacent bridge arms; and then constructing the $V_{CE}$ online measuring circuit, and finally connecting two input ends of the $V_{CE}$ online measuring circuit to the collecting electrode and the emitting electrode of the IGBT power module of one of the bridge arms of the full bridge inverter circuit.

3. The method for monitoring the online state of the bonding wire of the IGBT module according to claim 2, wherein a specific method for establishing the three-dimensional model of the health IGBT in the step 2 comprises:

simulating an environment temperature by adjusting a working temperature of a high-low temperature experimental box, wherein an environment temperature variation range simulated of the high-low temperature experimental box is 30-130° C., and controlling a forward on current variation range of the IGBT power module to be 20-60 A by changing the load of the full bridge inverter circuit; the IGBT power modules on the four bridge arms of the full bridge inverter circuit being healthy IGBT power modules, placing one of the healthy IGBT power modules in the high-low temperature experimental box, connecting the healthy IGBT power module in the full bridge inverter circuit after the environment temperature is stable, and measuring a saturation voltage drop of the IGBT power module in the full bridge inverter circuit once at an interval of 2 A of the forward on current of the IGBT power module when the environment temperature simulated in the high-low temperature experimental box is at an interval of 5° C.; and performing surface fitting on a three-dimensional array $(T_a, I_c, V_{CE})$ by using a cftool tool box in Matlab to obtain a saturation voltage drop curved surface of the healthy IGBT power module, wherein $T_a$ represents the environment temperature simulated by the high-low temperature experimental box, $I_c$ represents the forward on current of the IGBT power module, and $V_{CE}$ represents the saturation voltage drop of the IGBT power module.

4. The method for monitoring the online state of the bonding wire of the IGBT module according to claim 3, wherein a specific method for establishing the three-dimensional data model of the IGBT with the broken bonding wire in the step 3 comprises:

under a premise of protecting a encapsulation of the IGBT power module, performing a breaking experiment on the bonding wire of the IGBT power module manually to simulate a falling failure of the bonding wire due to a severe working environment or normal ageing in an actual working condition; each time after one bonding wire is broken, placing the IGBT power module in the high-low temperature experimental box, simulating the environment temperature by adjusting the working temperature of the high-low temperature experimental box, wherein the environment temperature variation range simulated in the high-low temperature experimental box is 30-130° C., and controlling the forward on current variation range of the IGBT power module to be 20-60 A by changing the load of the full bridge inverter circuit; measuring the saturation voltage drop of the IGBT power module in the full bridge inverter circuit once at an interval of 2 A of the forward on current of the IGBT power module when the environment temperature simulated in the high-low temperature experimental box is at an interval of 5° C. until all bonding wires in the IGBT power module are broken completely; and performing surface fitting on experimental data by using a cftool tool box in Matlab to obtain a saturation voltage drop curved surface of a failed IGBT power module with the broken bonding wire, wherein the quantity of the saturation voltage drop curved surfaces of the failed IGBT power module with the broken bonding wires is equal to the quantity of all bonding wires of the IGBT power module, and each time one more bonding wire is broken, a corresponding saturation voltage drop curved surface of the failed IGBT power module with the broken bonding wire is obtained.

5. The method for monitoring the online state of the bonding wire of the IGBT module according to claim 2, wherein a specific method for establishing the three-dimensional data model of the IGBT with the broken bonding wire in the step 3 comprises:

under a premise of protecting a encapsulation of the IGBT power module, performing a breaking experiment on the bonding wire of the IGBT power module manually to simulate a falling failure of the bonding wire due to a severe working environment or normal ageing in an actual working condition; each time after one bonding wire is broken, placing the IGBT power module in the high-low temperature experimental box, simulating the environment temperature by adjusting the working temperature of the high-low temperature experimental box, wherein the environment temperature variation range simulated in the high-low temperature experimental box is 30-130° C., and controlling the forward on current variation range of the IGBT power module to be 20-60 A by changing the load of the full bridge inverter circuit; measuring the saturation voltage drop of the IGBT power module in the full bridge inverter circuit once at an interval of 2 A of the forward on current of the IGBT power module when the environment temperature simulated in the high-low temperature experimental box is at an interval of 5° C. until all bonding wires in the IGBT power module are broken completely; and performing surface fitting on experimental data by using a cftool tool box in Matlab to obtain a saturation voltage drop curved surface of a failed IGBT power module with the broken bonding wire, wherein the quantity of the saturation voltage drop curved surfaces of the failed IGBT power module with the broken bonding wires is equal to the quantity of all bonding wires of the IGBT power module, and each time one more bonding wire is broken, a corresponding saturation voltage drop curved surface of the failed IGBT power module with the broken bonding wire is obtained.

6. The method for monitoring the online state of the bonding wire of the IGBT module according to claim 1, wherein a specific method for establishing the three-dimensional data model of the IGBT with the broken bonding wire in the step 3 comprises:

under a premise of protecting a encapsulation of the IGBT power module, performing a breaking experiment on the bonding wire of the IGBT power module manually to simulate a falling failure of the bonding wire due to a severe working environment or normal ageing in an actual working condition; each time after one bonding wire is broken, placing the IGBT power module in the high-low temperature experimental box, simulating the environment temperature by adjusting the working temperature of the high-low temperature experimental box, wherein the environment temperature variation range simulated in the high-low temperature experimental box is 30-130° C., and controlling the forward on current variation range of the IGBT power module to be 20-60 A by changing the load of the full bridge inverter circuit; measuring the saturation voltage drop of the IGBT power module in the full bridge inverter circuit once at an interval of 2 A of the forward on current of the IGBT power module when the environment temperature simulated in the high-low temperature experimental box is at an interval of 5° C. until all bonding wires in the IGBT power module are broken completely; and performing surface fitting on experimental data by using a cftool tool box in Matlab to obtain a saturation voltage drop curved surface of a failed IGBT power module with the broken bonding wire, wherein the quantity of the saturation voltage drop curved surfaces of the failed IGBT power module with the broken bonding wires is equal to the quantity of all bonding wires of the IGBT power module, and each time one more bonding wire is broken, a corresponding saturation voltage drop curved surface of the failed IGBT power module with the broken bonding wire is obtained.

7. The method for monitoring the online state of the bonding wire of the IGBT module according to claim 6, wherein a specific method for optimizing the least squares support vector machine by adopting the genetic algorithm in the step 4 comprises:

obtaining a series of the three-dimensional arrays ($T_a$,$I_c$, $V_{CE}$) according to the saturation voltage drop curved surfaces of the healthy IGBT power modules and the saturation voltage drop curved surfaces of the failed IGBT power module with broken bonding wires, dividing all the three-dimensional arrays ($T_a$,$I_c$,$V_{CE}$) obtained, according to the saturation voltage drop curved surfaces of the healthy IGBT power modules and the saturation voltage drop curved surfaces of the failed IGBT power module with broken bonding wires, into two portions: a part of the saturation voltage drop curved surfaces is taken as a training sample and a other part of the saturation voltage drop curved surfaces is taken as a test sample;

wherein the three-dimensional arrays ($T_a$,$I_c$,$V_{CE}$) obtained according to the saturation voltage drop curved surfaces of the failed IGBT power module with broken bonding wires comprise the three-dimensional array ($T_a$,$I_c$,$V_{CE}$) obtained according to the saturation voltage drop curved surface of the failed IGBT power module with one broken bonding wire, the three-dimensional array ($T_a$,$I_c$,$V_{CE}$) obtained according to the saturation voltage drop curved surface of the failed IGBT power module with two broken bonding wires, the three-dimensional array ($T_a$,$I_c$,$V_{CE}$) obtained according to the saturation voltage drop curved surface of the failed IGBT power module with A broken bonding wires, and the three-dimensional array ($T_a$,$I_c$, $V_{CE}$) obtained according to the saturation voltage drop curved surfaces of the failed IGBT power module with all the broken bonding wires, A being greater than or equal to 1 but smaller than or equal to the total number of the bonding wires;

with respect to the least squares support vector machine, different kernel functions show different classifying properties, a Gaussian radial basis (RBF) kernel function in a form of $K(x_i,x_j)=\exp(-\|x_i-x_j\|^2/2\sigma^2)$ is used, wherein σ represents a kernel parameter; selection of the kernel parameter σ of the least squares support vector machine and a regularization parameter γ of the least squares support vector machine affects a classifying precision of the least squares support vector machine, and in order to classifying failures of the bonding wires of the IGBT power modules quickly and accurately, parameters of the least squares support vector machine are optimized by adopting the genetic algorithm:

1) encoding: encoding the training sample with a Gray code;
2) generation of an initial population: randomly generating 50 groups of the kernel parameters σ and the regularization parameters γ of the least squares support vector machine, one group of parameters being a chromosome, 50 chromosomes being in total, σ and γ being two genes on the chromosomes, and initial value ranges of σ and γ being [0.1,100];
3) adaptability value evaluation detection: taking an accuracy obtained, by performing cross validation on the training sample, as a adaptability value of each chromosome in the genetic algorithm;
4) selection: sequencing the adaptability values of the chromosomes from large to small, and selecting the values according to a random competition selection method;
5) crossover: arranging a crossover probability $p_c$=0.5 and selecting two points to crossover;
6) mutation: setting a mutation probability $p_m$=0.01 selecting a new individual, and generated by a valid genetic mutation; and
7) terminating condition: setting a maximum iteration number of times at 200, putting the test sample in the least squares support vector machine, wherein if the accuracy does not reach an index and the iteration number of times is smaller than 200, selection, crossover and mutation operations are performed continuously, and if the accuracy reaches the index or the iteration number of times reaches 200, a chromosome individual with the maximum adaptability value is selected as an optimum parameter of the least squares support vector machine.

8. The method for monitoring the online state of the bonding wire of the IGBT module according to claim 1, wherein a specific method for estimating the states of the three-dimensional data models by utilizing the optimized least squares support vector machine in the step 5 comprises:

under a same condition, i.e., the forward on current and the environment temperature are same, obtaining a saturation voltage drop increment when A bonding wires of the IGBT are broken according to a difference value between a saturation voltage drop obtained when the A bonding wires of the IGBT are broken and the saturation voltage drop when the IGBT is healthy dividing by the saturation voltage drop when the IGBT is healthy, wherein A is greater than or equal to 1 but smaller than or equal to the total number of the bonding wires;

the failures of the bonding wires of the IGBT modules are divided into three grades according to the saturation voltage drop increment: healthy, bonding wire failure and chip failure, wherein corresponding saturation voltage drop increment intervals respectively are $\Delta V_{CE}<1\%$, $1\% \leq \Delta V_{CE}<5\%$ and $\Delta_{CE} \geq 5\%$; labels 1, 2 and 3 respectively represent the three grades: the failures of are bonding wires of the IGBT modules are healthy, the bonding wire failure and the chip failure;

constructing a classifying decision making function of the least squares support vector machine according to an optimum parameter obtained of the least squares support vector machine, wherein an output of the classifying decision making function of the least squares support vector machine is the grade of the failure of the bonding wires of the IGBT modules, the output of the classifying decision making function of the least squares support vector machine is 1, 2 or 3, and 1, 2 or 3 respectively represent three grades: the failed bonding wires of the IGBT modules are healthy, the bonding wire failure and the chip failure;

an input of the classifying decision making function of the least squares support vector machine is the saturation voltage drop of the IGBT power module measured under a working condition, i.e., the environment temperature and the on current are determined;

providing a training sample set $\{(x_1, y_1), \ldots, (x_n, y_n)\}$, wherein n represents a capacity of the training samples, $x_i \in R^n$ represents the $i^{th}$ training sample, $y_i$ represents an expected output of the $i^{th}$ training sample, i.e., a class label;

one training sample $x_i$ corresponds to one three-dimensional array $(T_a, I_c, V_{CE})$;

when the three-dimensional array $(T_a, I_c, V_{CE})$ as the training sample $x_i$ is obtained according to the saturation voltage drop curved surface of the healthy IGBT power module and the saturation voltage drop increment $\Delta V_{CE}<1\%$, the expected output $y_i$ of the training sample is equal to 1;

when the three-dimensional array $(T_a, I_c, V_{CE})$ as the training sample $x_i$ is obtained according to the saturation voltage drop curved surfaces of the IGBT with the broken bonding wires (1-3 bonding wires are broken) and the saturation voltage drop increment $1\% \leq \Delta V_{CE} \leq 5\%$, the expected output $y_i$ of the training sample is equal to 2;

when the three-dimensional array $(T_a, I_c, V_{CE})$ as the training sample $x_i$ is obtained according to the saturation voltage drop curved surfaces of the IGBT with the broken bonding wires (4-6 bonding wires are broken) and the saturation voltage drop increment $\Delta V_{CE} \geq 5\%$, the expected output $y_i$ of the training sample is equal to 3;

the classifying decision making function of the least squares support vector machine constructed according to the optimum parameter obtained of the least squares support vector machine is:

$$f(x) = \text{sgn}\left[\sum_{i=1}^{n} \omega^T K(x_i, x_j) + b\right],$$

wherein $\Omega$ represents a weight vector, b represents an offset constant, $K(x_i, y_j)$ represents a kernel function of the least squares support vector machine, $K(x_i, x_j) = \exp(-\|x_i - x_j\|^2 / 2\sigma^2)$ is a function of a kernel parameter $\sigma$, and $x_i$ and $x_j$ respectively represent the $i^{th}$ and $i^{th}$ sample inputs, $\Omega$ and b can be determined by solving a target function of the least squares support vector machine, the target function being:

$$\min_{\omega, b, \xi} J(\omega, \xi) = \frac{1}{2}\|\omega\|^2 + \frac{\gamma}{2}\sum_{i=1}^{n} \xi_i^2;$$

a constraint condition is as follows:

$y_i[\omega^T \cdot \varphi(x_i) + b] = 1 - \xi_i, i = 1, \ldots, n,$ wherein $x_i$ and $y_i$ respectively represent the $i^{th}$ training sample input and a corresponding output thereof, n represents the capacity of the training samples, $\gamma$ is a regularization parameter, $\xi_i$ is a relaxing factor, and $\xi_i \geq 0$, $\varphi(\cdot)$ is a mapping function of a kernel space.

\* \* \* \* \*